United States Patent
Yoshida et al.

(10) Patent No.: US 6,398,570 B1
(45) Date of Patent: Jun. 4, 2002

(54) SEMICONDUCTOR COMPONENT MOUNTING APPARATUS

(75) Inventors: Kenji Yoshida; Takashi Naito; Shigeru Murayama, all of Tokyo; Katsuhiko Sakamoto; Takashi Masaki, both of Kanagawa, all of (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/709,553

(22) Filed: Nov. 13, 2000

Related U.S. Application Data (62) Division of application No. 09/347,867, filed on Jul. 9, 1999.

(30) Foreign Application Priority Data

Jul. 9, 1998 (JP) ............................................ 10-194738

(51) Int. Cl.⁷ ................................................ H01R 13/15
(52) U.S. Cl. ........................ 439/259; 439/260; 439/265
(58) Field of Search ................................ 439/259, 260, 439/261, 262, 263, 264, 265, 266, 267, 636, 637, 630, 631, 632, 325

(56) References Cited

U.S. PATENT DOCUMENTS

| | | | |
|---|---|---|---|
| 4,145,620 A | | 3/1979 | Dice .......................... 324/501 |
| 4,176,900 A | | 12/1979 | Hines et al. .............. 324/158.1 |
| 4,540,227 A | * | 9/1985 | Faraci .......................... 439/64 |
| 5,414,370 A | | 5/1995 | Hashinaga et al. ......... 324/765 |

FOREIGN PATENT DOCUMENTS

| | | |
|---|---|---|
| JP | 54-137663 | 10/1979 |
| JP | 3-128985 | 12/1991 |
| JP | 3-280372 | 12/1991 |
| JP | H4-20239 | 2/1992 |
| JP | 6-43211 | 2/1994 |
| JP | 8-82653 | 3/1996 |

OTHER PUBLICATIONS

Full translation of Japanese Office Action issued in priority case entitled "Notification of Reason for Refusal," 2 pages.

Partial translation of Japanese Office Action (undated), 1 page.

* cited by examiner

*Primary Examiner*—P. Austin Bradley
*Assistant Examiner*—Ross Gushi
(74) *Attorney, Agent, or Firm*—Rosenthal & Osha L.L.P.

(57) ABSTRACT

A semiconductor component mounting apparatus for mounting a semiconductor component to test the electric characteristics of the semiconductor component, comprising: a contactor 20 with which the semiconductor component contacts; a substrate 30 which supplies an electric signal to the contactor 20; a plurality of connection components 40, each of which has an electric terminal 48 for supplying the electric signal to the substrate 30 and which is fixed to the substrate 30; a plurality of connectors 50 which has a contact pin 70 including a contact part 74 for contacting with the electric terminal 48 of the connection component 40, a housing 68 for holding the contact pin 70, a pushing part 78 for pushing the contact pin 70 to the electric terminal 48, and which is freely-detachably connected to one of the plurality of the connection components 40; a holder 80 which holds the plurality of the connectors 50, and a fixing part 86 which fixes the holder 80 to the substrate 30, wherein the contact part 74 slides along the electric terminal 48, while contacting with the electric terminal 40, when the pushing part 78 pushes the contact pin 70.

14 Claims, 6 Drawing Sheets

SEMICONDUCTOR COMPONENT MOUNTING APPARATUS

This patent application claims priority based on a Japanese patent application, H10-194730, filed on Jul. 9, 1998, and is a divisional application of U.S. patent application Ser. No. 09/347,867 filed Jul. 9, 1999.

BACKGROUND OF THE INVENTION

1. Field of Invention

The present invention relates to a semiconductor component mounting apparatus to mount a semiconductor component in order to test the electric characteristics of the semiconductor component. The present invention also relates to a connector which is electrically connected to a connection component.

2. Description of Related Art

In order for a connection component to be electrically connected to a connector reliably, the electric terminals of the connection component need to be pushed against the pins of the connector. Large pushing force increases the electric connectivity, but makes friction force larger, resulting in the difficulty of inserting the connection component to the connector or removing the connection component from the connector. In particular, in the case of the connector with a number of pins, or the connection components to be inserted into a number of connectors simultaneously, large force must be used to insert the connection components.

In order to overcome the above problem, a so-called Zero Insertion Force (ZIF) connector is proposed, which does not need any force when the connection component is inserted, and pushes the pins against the connection component after the connection component is inserted. However, when the pins are pushed against the connection component, the relative position may change slightly. When high accuracy of the relative position between the connector and the connection component is required, slight shift of the connection component when the pins are pushed is fatal.

For instance, in a semiconductor testing apparatus, on extreme high reliability for electrical connectivity and position accuracy is required. In order to test the semiconductor fast and reliably, the connector used in the testing apparatus must be reliably connected to the connection component. Furthermore, in order to test various types of semiconductor components, various types of substrates containing contactors which get contact with the semiconductor must be provided. Therefore, it is desirable that the connector used in the semiconductor testing apparatus can easily install and remove these various types of substrates.

SUMMARY OF THE INVENTION

Therefore, it is an object of the present invention to overcome these drawbacks in the prior art, and to provide a semiconductor component mounting apparatus and a connector. This object is achieved by combinations described in the independent claims. The dependent claims define further advantageous and exemplary combinations of the present invention.

In order to achieve the object, a semiconductor component mounting apparatus according to the first embodiment of the present invention is a semiconductor component mounting apparatus for mounting a semiconductor component to test electric characteristics of the semiconductor component, comprising: a contactor with which the semiconductor component contacts; a substrate which supplies an electric signal to the contactor; a plurality of connection components, each of which has an electric terminal for supplying the electric signal to the substrate and which is fixed to the substrate; a plurality of connectors, each of which has a contact pin including a contact part for contacting with a respective electric terminal of the connection component, a housing for holding the contact pin, a pushing part for pushing the contact pin to the electric terminal, and which is freely-detachably connected to one of the plurality of the connection components; a holder which holds the plurality of the connectors; and a fixing part which fixes the holder to the substrate, wherein the contact part slides along the electric terminal, while contacting with the electric terminal, when the pushing part pushes the contact pin.

The direction in which the contact part slides along the electric terminal may be the removing direction in which the connection component is removed from the connector. The direction in which the contact part slides along the electric terminal may be the inserting direction in which the connection component is inserted to the connector.

The plurality of the connection component may be arranged spokewise on the substrate; and the plurality of the connector may be arranged spokewise on the holder.

Each of the two pushing part may have a rotational cam, and the semiconductor component mounting apparatus may further comprises a handle to rotate the rotational cam for each of the rotational cam; and the handles may be attached to the outer rim of the plurality of the connectors arranged spokewise.

The semiconductor component mounting apparatus may further comprises a handle driving part which is attached to the outside of the plurality of the handles and drives the plurality of the handles.

A connector according to the second embodiment of the present invention is a connector which is electrically connected to a connection component to be connected, comprising: a contact pin which is connected to an electric terminal of the connection component; a housing which holds the contact pin; at least two rotational cams which push the contact pin against the electric terminal and are symmetrically set at the right and left side; a handle which rotates the rotational cam; and a handle operation part which is attached to an end of the handle and at least a part of whose surface is spheric.

Each of the two pushing parts may have a rotational cam; and the handle may rotate the rotational cam.

The handle may have a lever part which is connected to the rotational cam and extends in a radial direction of the rotational cam, and an extension part which is attached to an end of the lever part and extends in an axial direction of the rotational cam; and the handle operation part is attached to an end of the extension part. The handle is provided for each of the rotational cam.

A connector according to the third embodiment of the present invention is a connector which is electrically connected to a connection component to be connected, comprising: a contact pin which is connected to an electric terminal of the connection component; a housing which holds the contact pin; at least two rotational cams which push the contact pin against the electric terminal and are symmetrically set at the right and left side; a rotational cam holder which is attached to the outside of the housing and holds the rotational cam; a taper part whose thickness lessens along the axial direction of the rotational cam.

The connector may further comprise a setting part at an end of an thin part whereabouts the thickness of two of the taper part becomes thinnest, which sets the connector to a connector base.

The connector may further comprise a setting part at an end of an thick part whereabouts the thickness of two of the taper part becomes thickest, which sets the connector to a connector base.

This summary of the invention does not necessarily describe all necessary features so that the invention may also be a sub-combination of these described features.

BRIEF DESCRIPTION OF THE DRAWINGS

The above and other objects and features of the invention will become more apparent from the following detailed description of the preferred embodiments with reference to the attached drawings, wherein.

DETAILED DESCRIPTION OF THE PREFERRED EMBODIMENTS

The invention will now be described based on the preferred embodiments, which do not intend to limit the scope of the present invention, but exemplify the invention. All of the features and combinations thereof described in the embodiments are not necessarily essential to the invention.

Figure 1:
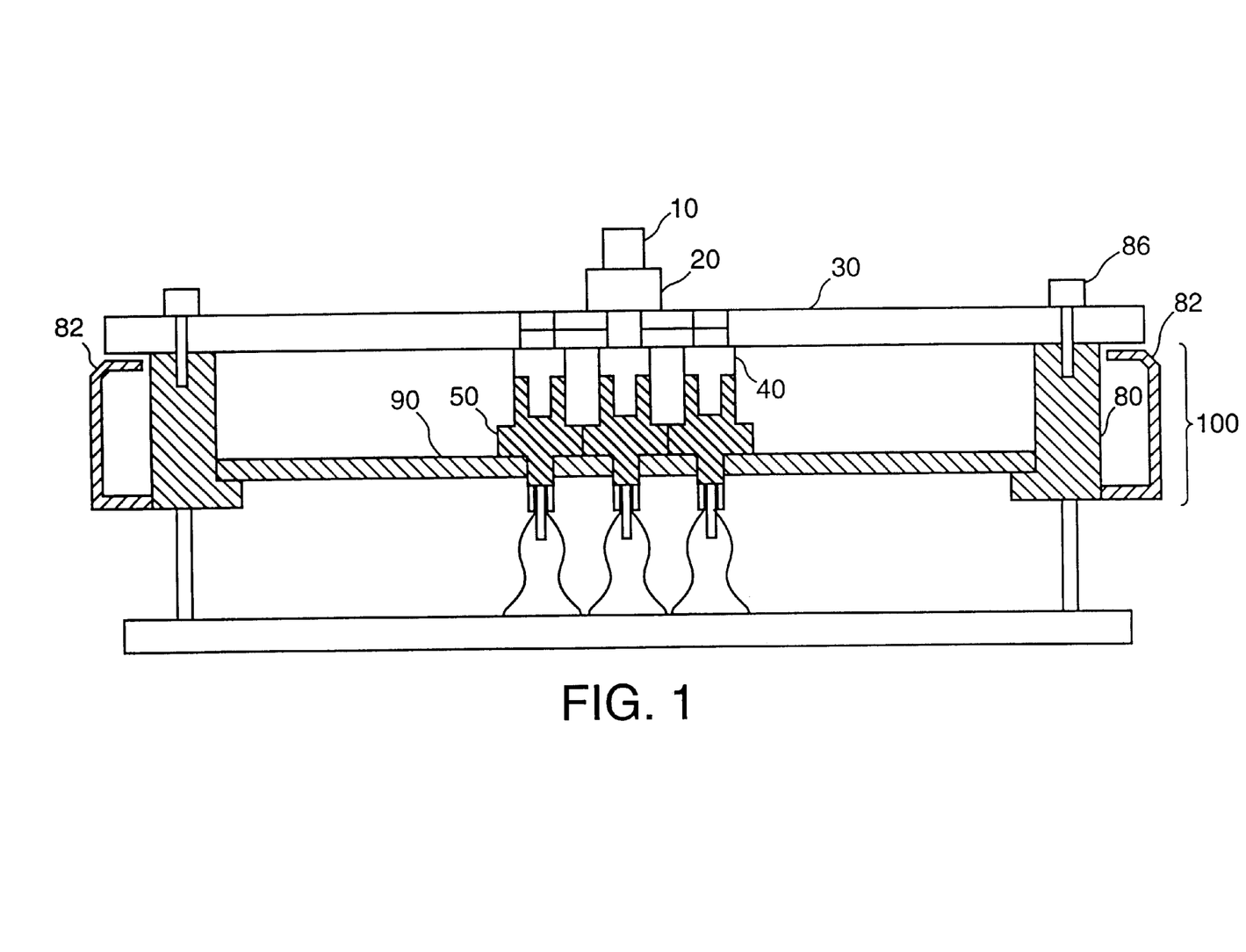
FIG. 1 is a cross-sectional view of a semiconductor component mounting apparatus relating to an embodiment of the present invention.

FIG. 1 is a cross sectional view of a semiconductor component mounting apparatus to mount semiconductor components to test the electric characteristics of the semiconductor components. As shown in FIG. 1, the semiconductor component mounting apparatus according to an embodiment of the present invention comprises a contactor 20 with which a semiconductor component contacts, and a substrate 30 which supplies an electric signal to the contactor 20, a plurality of connection components 40 which is fixed to the substrate 30, a plurality of connectors 50 which are freely-detachably connected to each of the plurality of the connection components 40, a connector base 90 to which the plurality of the connectors 50 are fixed, and a holder 80 which holds the plurality of the connectors 50 and connector base 90.

The substrate 30 and the connector base 90 are circular, and from their center, the plurality of the connection components 40, the connectors 50 and fixing parts 86 such as bolts are arranged spokewise. Since the relative position of the substrate 30 and the holder 80 is fixed, the relative position of the connection component 40 and the connector 50 can be maintained.

Figure 2:
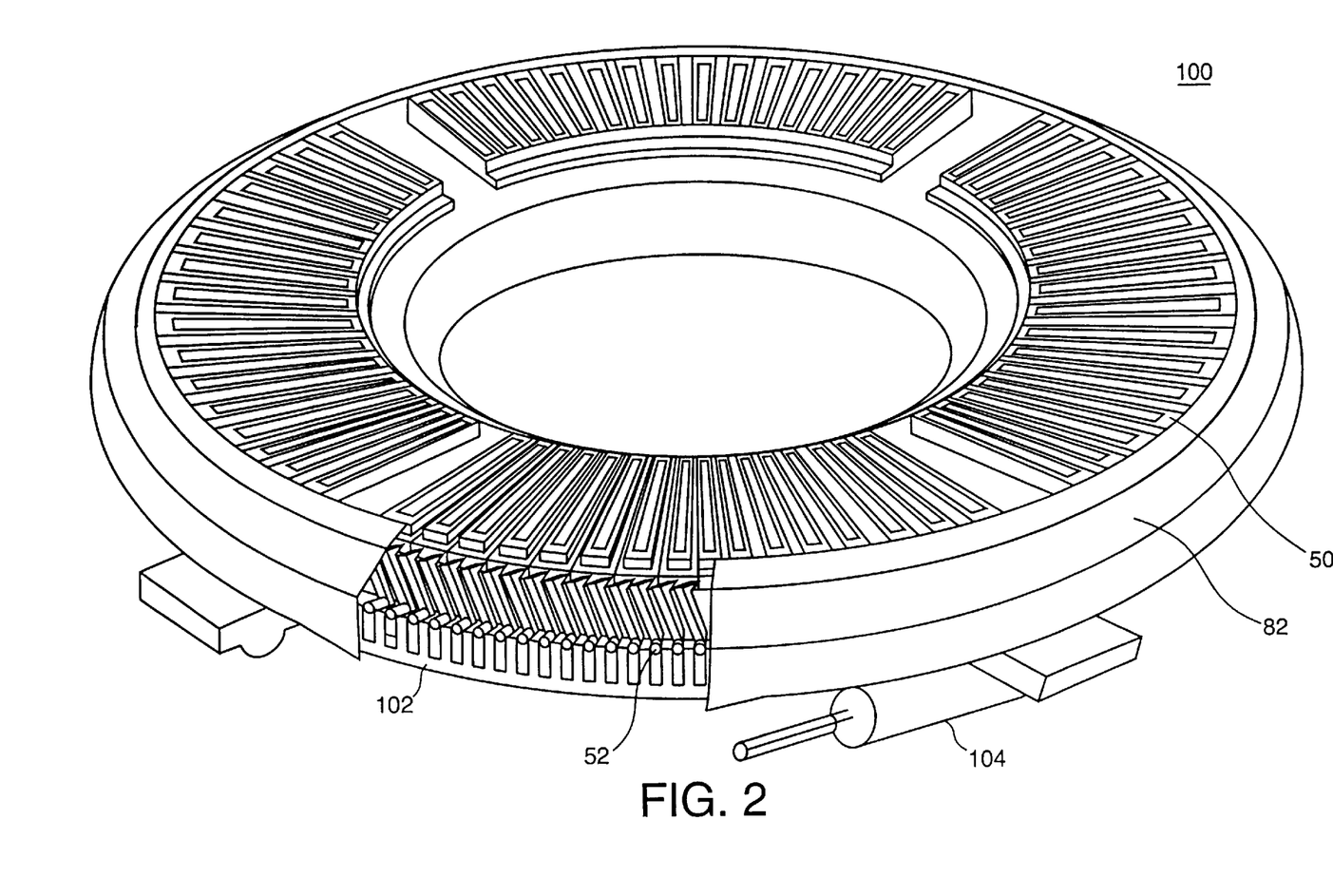
FIG. 2 is a perspective view of the connector unit 100 shown in FIG. 1.

FIG. 2 is a perspective view of the connector unit 100 (hatched) shown in FIG. 1. Two handles 52 to rotate a rotational cam built in the connector are attached to the outside of each of the connector 50. At the outer rim of the handle 52, a guide 102 to drive the handle 52 and a handle driving part 104 to rotate the guide 102 are further attached. By driving the handle driving part 104 with the connection component 40 inserted in the connector 50, the guide 102 and the plurality of the handles 52 move at the same time, and the connector 50 is connected to the connection component 40. Therefore the plurality of the connectors 50 can be simultaneously and easily fitted to the connection components 40.

Figure 3:
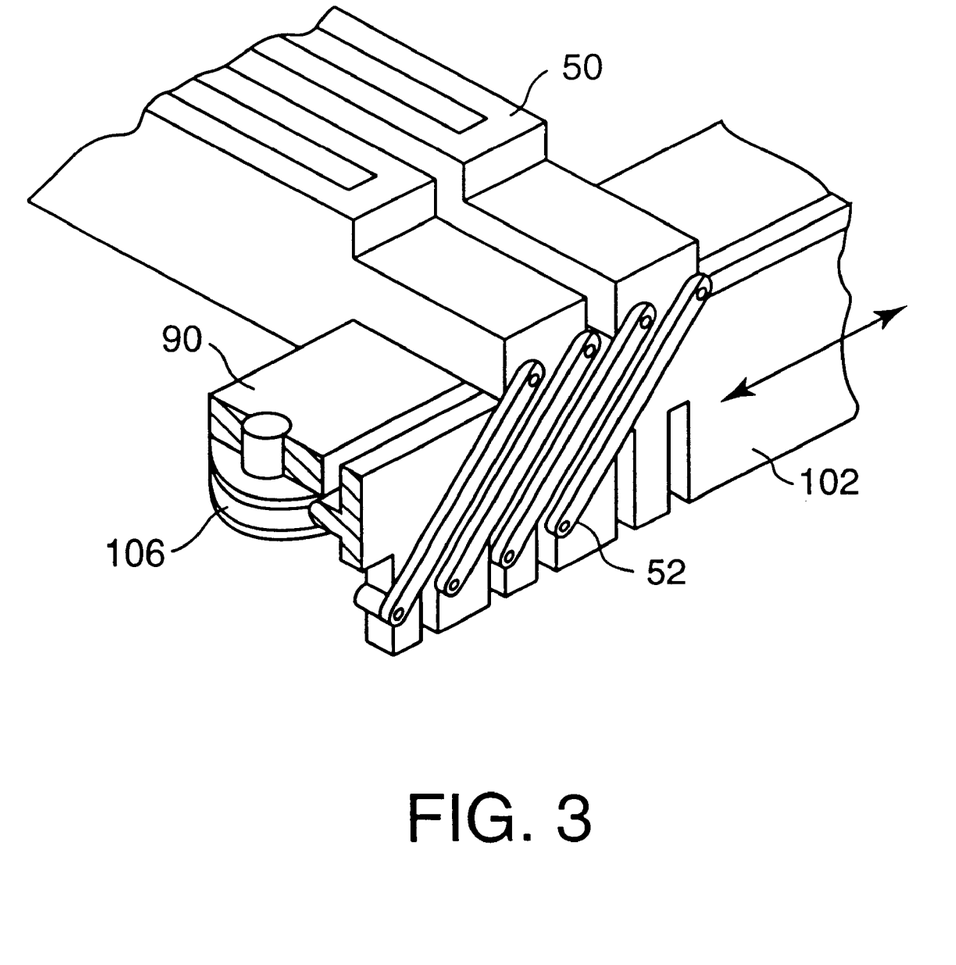
FIG. 3 an enlarged view of another example of the handle 52 and the guide 102.

FIG. 3 is an enlarged view of another example of the handle 52 and the guide 102 shown in FIG. 2. In FIG. 2, the guide 102 are attached to the outer rim of the handle 52, but the guide 102 may be attached to the inner rim of the handle 52 as shown in FIG. 3. In addition, in order to smoothly rotate the guide 102 against the connector 50, it is also preferable that a pulley 106 may be attached between the connector base 90 and the guide 102.

Figure 4:
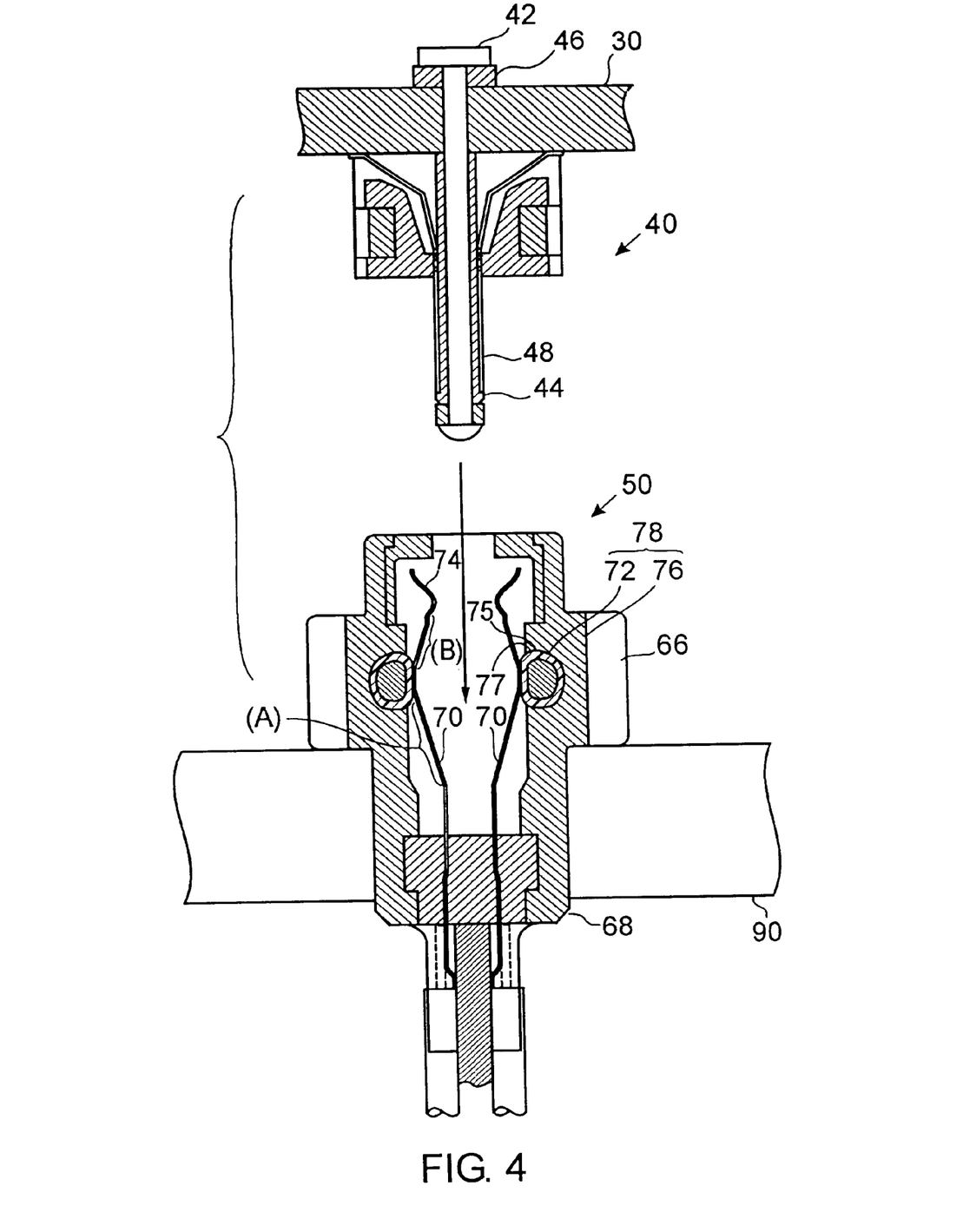
FIG. 4 is a cross sectional view illustrating how the connection component 40 is inserted into the connector 50 shown in FIG. 1.
Figure 5A:
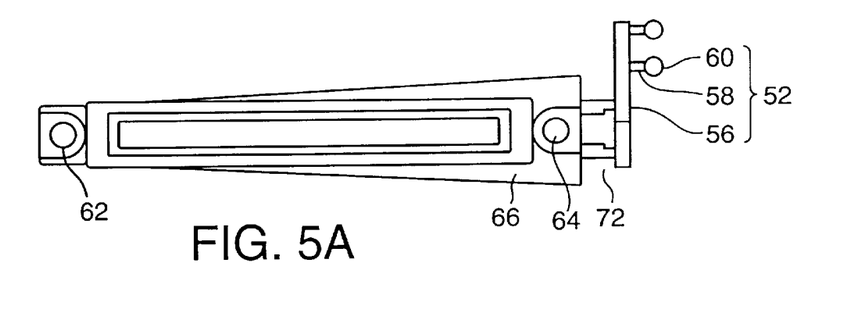
FIG. 5 is the detailed view of the connector 50 shown in FIG. 1.
Figure 5B:
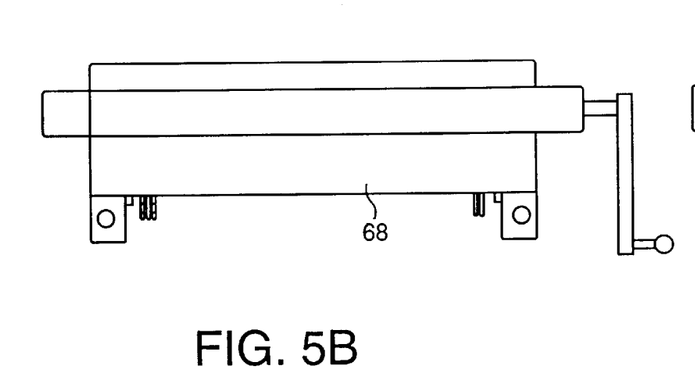
Figure 5C:
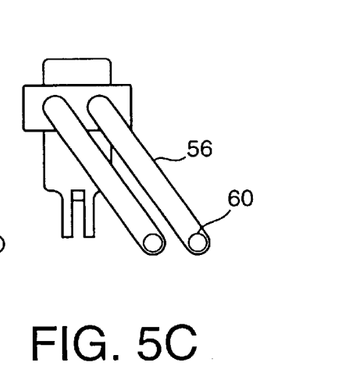
Figure 5D:
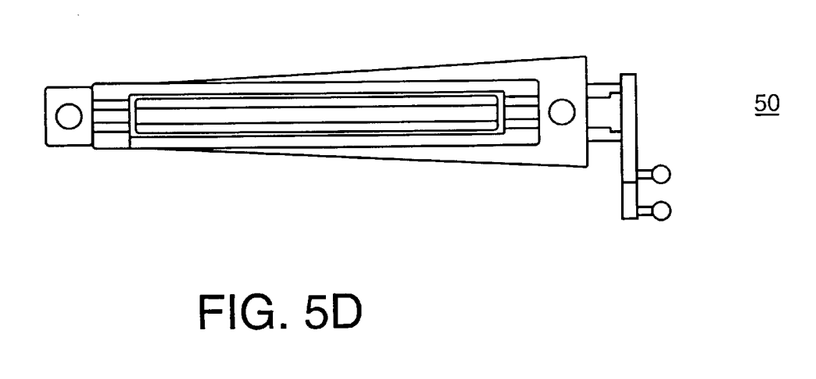
Figure 6A:
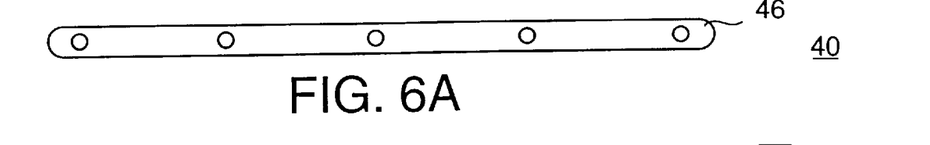
FIG. 6 is the detailed view of the connection component 40 shown in FIG. 1.
Figure 6B:
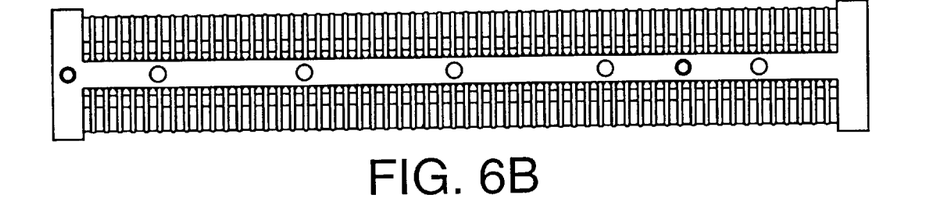
Figure 6C:
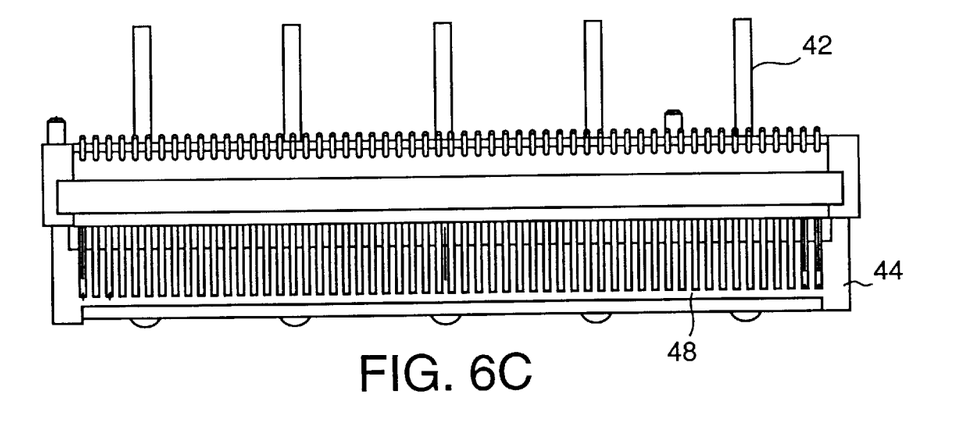
Figure 6D:
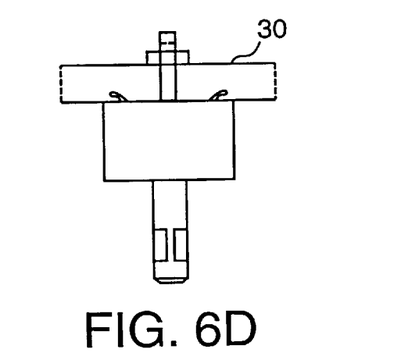
Figure 6E:
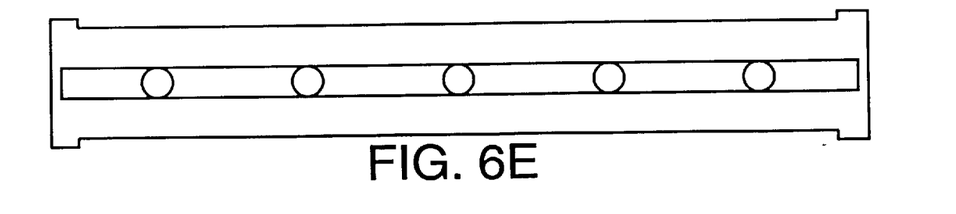

FIG. 4 is a cross-sectional view illustrating how the connection component 40 is inserted into the connector 50 shown in FIG. 1. The connection component 40 has a rivet 42 to be fitted to the substrate 30, a reinforcement board 46 to reinforce the part of the rivet 42 which is fixed, an electric terminal 48 which supplies an electric signal to the substrate 30, and an electric terminal holder 44 which holds the electric terminal 48.

On the other hand, the connector 50 has a contact pin 70 which contacts with the electric terminal 48 of the connection component 40, a housing 68 which holds the contact pin 70, at least two pushing parts 78 which push the contact pin 70 toward the electric terminal 48 and are symmetrically located at the right and left sides. Each of the two pushing parts 78 has a rotational cam 72 and a rotational cam holder 76 which holds the rotational cam 72. As the rotational cam 72 rotates, the contact part between the rotational cam 72 and the contact pin 70 moves toward the connection component 40 by the almost same distance, and the contact pin 70 is pushed against the electric terminal 48. Since the rotational cam holder 76 receives reaction from the contact pin 70 being pushed, the rotational cam holder 76 must be rigid enough to prevent its deflection. Therefore, it is preferable that the thickness of the rotational cam holder 76 may be large enough to stick out to the outside of the housing 68.

The rotational cam 72, for instance, includes a circumferential part 75 which has the almost same distance from the center of the rotational cam, and a flatter part 77 whose distance from the center is shorter than the distance from the center to the circumferential part. The contact pins 70 are arranged symmetrically at the right and left sides in two lines. As the two rotational cams 72 rotate, each of the two pushing parts 78 pushes the plurality of the contact pins 70 at the left side and the plurality of the contact pins 70 at the right side respectively. Herein, in order to prevent the contact pins 70 in each line from short-circuiting each other, the rotational cam 72 must be insulated. Therefore, it is preferable that the surface of the rotational cam 72 is, for instance, Teflon-coated.

When the right and left rotational cams 72 rotate in the same direction, the upper part of one rotational cam 72 pushes one contact pin 70, the lower part of the other rotational cam 72 pushes the other contact pin 70. Herein, in order to prevent the connection component 40 from moving against connector 50, it is preferable that the right and left contact pins 70 are pushed equally. Therefore, it is preferable that each of the rotational cams 72, before the pushing part 78 pushes the contact pin 70, is in a symmetric form in the direction of inserting the connection component 40. It is further preferable that the positions in which the two rotational cams 72 contact with the contact pins 70 are symmetric against the center of the connection component 40, when the pushing part 78 pushes the contact pin 70.

The contact pin 70 includes a contact part 74 which contacts with the electric terminal 48 of the connection component 40. When the pushing part 78 pushes the contact pin 70, the contact part 74 slides along the electric terminal 48, while contacting with the electric terminal 48. Hereby, the surface of the electric terminal 48 is scrabbled and the oxidized coat and dust are removed, so that the contact pin 70 can be reliably connected to the electric terminal 48. When the contact part 74 slides, if the connection component 40 and the connector 50 slip along the direction in which the contact pins 70 are arranged, the connectivity could be lost. To prevent this, it is desirable that the direction in which the contact part 74 slides is vertical to the direction in which contact pins 70 are arranged. Therefore, in the example shown in FIG. 4, the contact part 74 slides in the removing direction in which the connection component 40 is removed from the connector 50. In another example, the contact part 74 may slide along the inserting direction in which the connection component 40 is inserted to the connector 50.

FIG. 5 is detailed view of connector 50 shown in FIG. 1. At the outer rim of the plurality of the connectors 50 arranged spokewise on the connector base 90, a handle 52 to rotate the rotational cam 72 are attached for each rotational cam 72. The handle 52 has a lever part 56 which is connected to the rotational cam 72 and extends in the radial direction of the rotational cam 72, and an extension part 58 which is attached to the end of the lever part 56 and extends in the axial direction of the rotational cam 72. A handle operation part 60 at least a part of whose surface is spheric is further attached to the end of the extension part 58. Hereby, the handle 52 can be smoothly turned around when the guide 102 (FIG. 2) does not always push the handle 52 from the right side.

The connector 50 has a taper part 66 whose thickness lessens along the axial direction of the rotational cam 72. Hereby, when the connector 50 are arranged spokewise, the gap between the adjacent connectors 50 becomes small and prevents dust from falling between the connectors 50. At the both ends of the long hand of the connector 50, whereabouts the thickness of two of the taper part 66 becomes thinnest and thickest, the setting parts 62 and 64 are attached to set the connector 50 to the connector base 90. Since the setting parts 62 and 64 are arranged only at the both ends, it can narrow the gap between the adjacent connectors 50. As a result, a number of connectors 50 can be arranged on the connectors base 90.

FIG. 6 is the detailed view of the connection component 40 shown in FIG. 1. The connection component 40 has a number of electric terminals 48 which convey the signals received from the connectors 50 to the substrate 30, an electric terminal holder 44 which holds the electric terminals 48, rivets 42 which fix the connection component to the substrate 30, and a reinforcement board 46 which reinforces the contact part of the rivet 42 and the connection component 40. The rivets 42 are pierced through the connection component 40 as a whole, and further pierced through the substrate 30 and the reinforcement board 46, and then the end of the rivet 42 are crimped and the connection component 40 is fixed to the substrate 30. Hereby, compared to the case in that the connection component 40 is soldered at the substrate 30, the connection component can be more firmly fixed to the substrate, and it can prevent the connection component from separating.

As clearly understood from the above explanation, the present invention provides a connector which can connect easily, exactly and reliably to the connection component.

Although the present invention has been described by way of exemplary embodiments, it should be understood that many changes and substitutions may be made by those skilled in the art without departing from the spirit and the scope of the present invention which is defined only by the appended claims.

What is claimed is:

1. A connector, which is electrically connected to a connection component to be connected by being driven by a connector guide having a cut portion, comprising:

a contact pin which is connected to an electric terminal of said connection component;

a housing which holds said contact pin;

a pushing part which pushes said contact pin against said electric terminal and face to each other;

a handle which rotates said pushing parts; and a handle operation part which is attached to an end of said handle and at least a part of whose surface is spheric, said handle operation part being engaged with said cut portion.

2. A connector as claimed in claim 1, wherein:

each of said pushing parts has a rotational cam; and said handle rotates said rotational cam.

3. A connector as claimed in claim 2, wherein said handle is provided for each of said rotational cam.

4. A connector as claimed in claim 2, further comprising:

a rotational cam holder which is attached to an outside of said housing and holds said rotational cam;

a handle which rotates said rotational cam; and a taper part whose thickness lessens from an end part of said rotational cam, to which said handle is connected, toward the other end part of said rotational cam along an axial direction of said rotational cam.

5. A connector as claimed in claim 2, wherein said contact pin further includes:

a contact part for contacting with said electric terminal of said connection component;

a middle part extending from said contact part; and a lower part further extending from said middle part, wherein, when said pushing part does not push said middle part to said electric terminal, a distance from said middle part to said electric terminal is larger than a distance from said lower part to said electric terminal and a distance from said contact part to said electric terminal, and when said pushing part pushes said contact pin.

6. A connector as claimed in claim 2, comprising at least two said pushing parts which push said contact pin against said electric terminal and face to each other.

7. A connector as claimed in claim 6, further comprising a setting part at an end of a thin part whereabouts a thickness of said taper part becomes thinnest, which sets said connector to a connector base.

8. A connector as claimed in claim 6, further comprising a setting part at an end of a thick part whereabouts a thickness of said taper part becomes thickest, which sets said connector to a connector base.

9. A connector, which is electrically connected to a connection component to be connected, comprising:

a contact pin which is connected to an electric terminal of said connection component;

a housing which holds said contact pin;

at least two pushing parts which push said contact pin against said electric terminal and face to each other;

a handle which rotates said pushing parts; and a handle operation part which is attached to an end of said handle and at least a part of whose surface is spheric, each of said two pushing parts has a rotational cam; and said handle rotates said rotational cam;

wherein:

said handle has a lever part which is connected to said rotational cam and extends in a radial direction of said rotational cam, and an extension part which is attached to an end of said lever part and extends in an axial direction of said rotational cam; and said handle operation part is attached to an end of said extension part.

10. A connector which is electrically connected to a connection component to be connected, comprising:

a contact pin which is connected to an electric terminal of said connection component;

a housing which holds said contact pin;

a rotational cam which pushes said contact pin against said electric terminal and face to each other;

a rotational cam holder which is attached to an outside of said housing and holds said rotational cam;

a taper part whose thickness lessens from an end of said rotational cam, to which said handle is connected, toward the other end of said rotational cam along an axial direction of said rotational cam.

11. A connector as claimed in claim 10, further comprising a setting part at an end of a thin part whereabouts a thickness of said taper part becomes thinnest, which sets said connector to a connector base.

12. A connector as claimed in claim 10, further comprising a setting part at an end of a thick part whereabouts a thickness of said taper part becomes thickest, which sets said connector to a connector base.

13. A connector as claimed in claim 10, comprising at least two said rotational cams which push said contact pin against said electric terminal and face to each other.

14. A connector as claimed in claim 10, wherein said contact pin further includes:

a contact part for contacting with said electric terminal of said connection component;

a middle part extending from said contact part; and a lower part further extending from said middle part, wherein, when said pushing part does not push said middle part to said electric terminal, a distance from said middle part to said electric terminal is larger than a distance from said power part to said electric terminal and a distance from aid contact part to said electric terminal, and when said pushing part pushes said contact pin.

* * * * *

UNITED STATES PATENT AND TRADEMARK OFFICE
CERTIFICATE OF CORRECTION

PATENT NO. : 6,398,570 B1 Page 1 of 1
DATED : June 4, 2002
INVENTOR(S) : Kenji Yoshida et al.

It is certified that error appears in the above-identified patent and that said Letters Patent is hereby corrected as shown below:

Title page,
Item [73], Assignee, please insert the second Assignee name of -- AMP (Japan) Ltd., Kanagawa (JP) --.

Signed and Sealed this

Twenty-first Day of October, 2003

JAMES E. ROGAN
*Director of the United States Patent and Trademark Office*